US009383227B2

(12) United States Patent
Sterling

(10) Patent No.: US 9,383,227 B2
(45) Date of Patent: *Jul. 5, 2016

(54) THROUGH BIAS POLE FOR IGMR SPEED SENSING

(71) Applicant: Infineon Technologies AG, Neubiberg (DE)

(72) Inventor: James William Sterling, Novi, MI (US)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/849,990

(22) Filed: Sep. 10, 2015

(65) Prior Publication Data

US 2015/0377651 A1    Dec. 31, 2015

Related U.S. Application Data

(63) Continuation of application No. 12/796,276, filed on Jun. 8, 2010, now Pat. No. 9,170,309.

(51) Int. Cl.
*G01B 7/14* (2006.01)
*G01D 5/16* (2006.01)
(Continued)

(52) U.S. Cl.
CPC . *G01D 5/16* (2013.01); *B82Y 25/00* (2013.01); *G01D 5/145* (2013.01); *G01P 3/487* (2013.01); *G01R 33/093* (2013.01); *H03M 1/06* (2013.01); *H03M 1/30* (2013.01)

(58) Field of Classification Search
CPC ........ G01R 33/07; G01R 33/93; G01R 33/09; G01R 15/20; G01R 15/202

USPC .............. 324/207.11–207.26, 219, 167, 259, 324/260, 262, 529, 750.21, 173, 179
See application file for complete search history.

(56) References Cited

U.S. PATENT DOCUMENTS

| 4,110,676 A | 8/1978 | Edick et al. |
| 5,585,719 A | 12/1996 | Endo et al. |

(Continued)

FOREIGN PATENT DOCUMENTS

| DE | 19719019 A1 | 11/1997 |
| DE | 10325317 A1 | 2/2004 |

(Continued)

OTHER PUBLICATIONS

Notice of Allowance Dated Jun. 22, 2015 U.S. Appl. No. 12/796,276.
(Continued)

*Primary Examiner* — Tung X Nguyen
*Assistant Examiner* — Thang Le
(74) *Attorney, Agent, or Firm* — Eschweiler & Associates, LLC

(57) ABSTRACT

One embodiment relates to a sensing system that includes a magnetic encoder wheel having alternating pole magnetic domains along a circumference thereof. The magnetic encoder wheel is configured to rotate about a first axis. The sensing system further includes a magnetic field sensing element in spatial relationship with the magnetic encoder wheel that is oriented to sense magnetic field components extending generally in a direction parallel to a second axis that is perpendicular to the first axis. The sensing system also includes a magnetic flux influencing element configured to influence magnetic field components associated with the alternating pole magnetic domains of the magnetic encoder to reduce magnetic field components associated with the first axis.

22 Claims, 6 Drawing Sheets

(51) Int. Cl.
*B82Y 25/00* (2011.01)
*G01D 5/14* (2006.01)
*G01P 3/487* (2006.01)
*G01R 33/09* (2006.01)
*H03M 1/06* (2006.01)
*H03M 1/30* (2006.01)

(56) References Cited

U.S. PATENT DOCUMENTS

| | | | |
|---|---|---|---|
| 5,666,248 A | 9/1997 | Gill | |
| 5,883,567 A | 3/1999 | Mullins, Jr. | |
| 6,084,401 A * | 7/2000 | Palma | G01D 5/145 |
| | | | 324/207.21 |
| 6,111,403 A | 8/2000 | Yokotani et al. | |
| 6,577,124 B2 | 6/2003 | Coehoorn et al. | |
| 6,670,807 B2 * | 12/2003 | Cox | H01L 21/67259 |
| | | | 324/207.2 |
| 6,912,923 B2 | 7/2005 | Froehlich et al. | |
| 7,397,236 B2 | 7/2008 | Tatenuma et al. | |
| 8,587,297 B2 | 11/2013 | Ausserlechner | |
| 8,803,518 B2 | 8/2014 | Meisenberg et al. | |
| 2003/0141864 A1 | 7/2003 | Babin | |
| 2003/0155911 A1 * | 8/2003 | Kaste | G01D 5/147 |
| | | | 324/207.26 |
| 2004/0027712 A1 * | 2/2004 | Yokotani | G01D 5/145 |
| | | | 360/66 |
| 2004/0251896 A1 | 12/2004 | Mizutani et al. | |
| 2005/0030018 A1 | 2/2005 | Shibahara et al. | |
| 2006/0255797 A1 | 11/2006 | Taylor et al. | |
| 2007/0063695 A1 * | 3/2007 | Ruhrig | G01R 33/09 |
| | | | 324/207.21 |
| 2007/0278851 A1 | 12/2007 | Nakamura et al. | |
| 2009/0001971 A1 * | 1/2009 | Racz | G01D 5/145 |
| | | | 324/207.25 |
| 2009/0140725 A1 * | 6/2009 | Ausserlechner | G01R 33/072 |
| | | | 324/207.2 |
| 2009/0243595 A1 * | 10/2009 | Theuss | B29C 45/14639 |
| | | | 324/207.11 |
| 2011/0062956 A1 * | 3/2011 | Edelstein | G01R 33/0286 |
| | | | 324/251 |
| 2011/0127998 A1 * | 6/2011 | Elian | B82Y 25/00 |
| | | | 324/219 |

FOREIGN PATENT DOCUMENTS

| | | |
|---|---|---|
| DE | 10314602 A1 | 10/2004 |
| DE | 102009030020 A1 | 1/2010 |

OTHER PUBLICATIONS

Final Office Action Dated Apr. 14, 2015 U.S. Appl. No. 12/796,276.
Non-Final Office Action Dated Dec. 15, 2014 U.S. Appl. No. 12/796,276.
Non-Final Office Action Dated Jul. 22, 2014 U.S. Appl. No. 12/796,276.

* cited by examiner

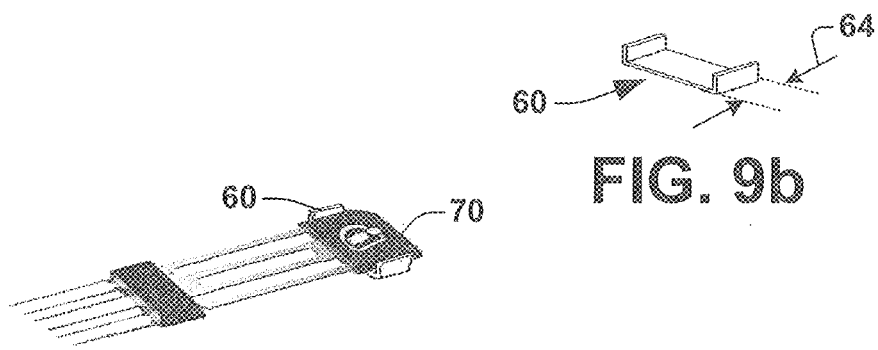
FIG. 9a
FIG. 9b
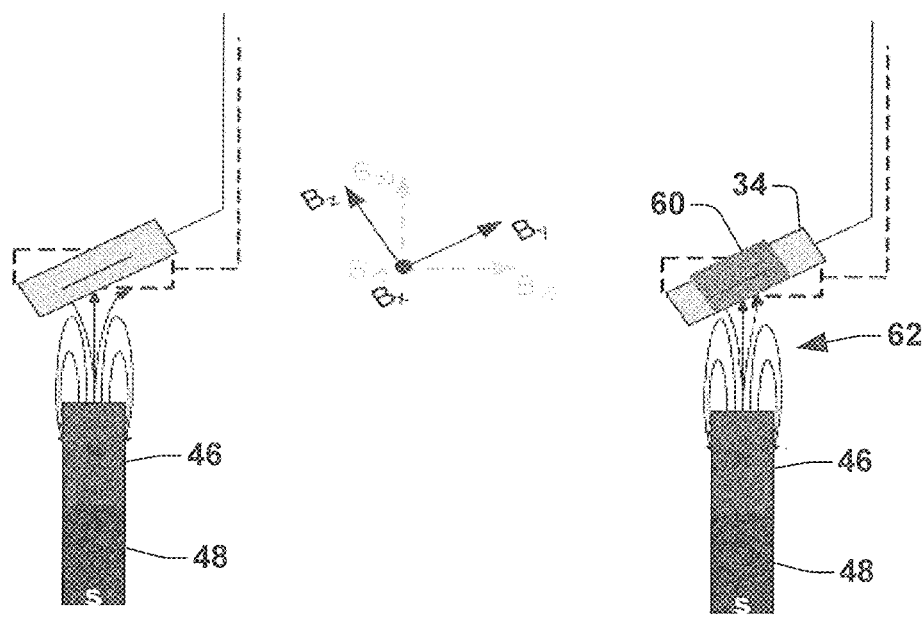
FIG. 10

THROUGH BIAS POLE FOR IGMR SPEED SENSING

CROSS REFERENCE TO RELATED APPLICATIONS

This application is a Continuation of U.S. patent application Ser. No. 12/796,276 filed Jun. 8, 2010 entitled "Through Bias Pole for IGMR Speed Sensing" and is hereby incorporated by reference in its entirety.

FIELD

The present disclosure relates to generally to magnetic sensing systems such as rotational speed, acceleration and rotational direction of a rotating element such as a shaft or gear in automotive applications or other type applications.

BACKGROUND

In many applications, it is useful to detect changes in magnetic field to track translational motion, rotational motion, proximity, speed and the like. Accordingly, magnetic field sensors are used in a wide variety of applications to detect subtle (or drastic) changes in magnetic field.

Magnetic field sensors are often used in large scale industrial applications, such as in automobiles. For example, magnetic field sensors are often used to detect the angle of a crankshaft or camshaft, and can also be used to measure tire speed rotation and a host of other conditions. Magnetic field sensors are also used in small-scale devices, such as computers. For example, magneto resistive sensors are currently the leading technology used for read heads in computer hard disks. Due to the wide range of applications, improvements in magnetic field sensors are a valuable contribution to the marketplace.

SUMMARY

The following presents a simplified summary of the disclosure in order to provide a basic understanding of some aspects of the disclosure. This summary is not an extensive overview of the disclosure, and is neither intended to identify key or critical elements of the disclosure nor to delineate the scope of the disclosure. Rather, the purpose of the summary is to present some concepts of the disclosure in a simplified form as a prelude to the more detailed description that is presented later.

A sensing system is provided and comprises a magnetic encoder wheel comprising alternating pole magnetic domains along a circumference thereof, wherein the magnetic encoder wheel is configured to rotate about a first axis. The system further comprises a magnetic field sensing element in spatial relationship with the magnetic encoder wheel and oriented to sense magnetic field components extending generally in a direction parallel to a second axis that is perpendicular to the first axis. The system further comprises a magnetic flux influencing element configured to influence magnetic field components associated with the alternating pole magnetic domains of the magnetic encoder to reduce magnetic field components associated with the first axis.

The following description and annexed drawings set forth in detail certain illustrative aspects and implementations of the disclosure. These are indicative of but a few of the various ways in which the principles of the disclosure may be employed.

BRIEF DESCRIPTION OF THE DRAWINGS

FIGS. 9a and 9b are isometric views illustrating a through pole piece wrapped around an integrated circuit containing a magnetic field sensor, and the through pole piece standing alone according to one embodiment of the invention.

FIG. 10 shows fragmentary views of a tilted magnetic field sensor in proximity to a magnetic encoder wheel providing a magnetic field, and a tilted magnetic field sensor having a through pole associated therewith, and the various field components illustrated as flux lines that are re-directed to a preferred axis according to one embodiment of the invention.

DETAILED DESCRIPTION

Figure 1:
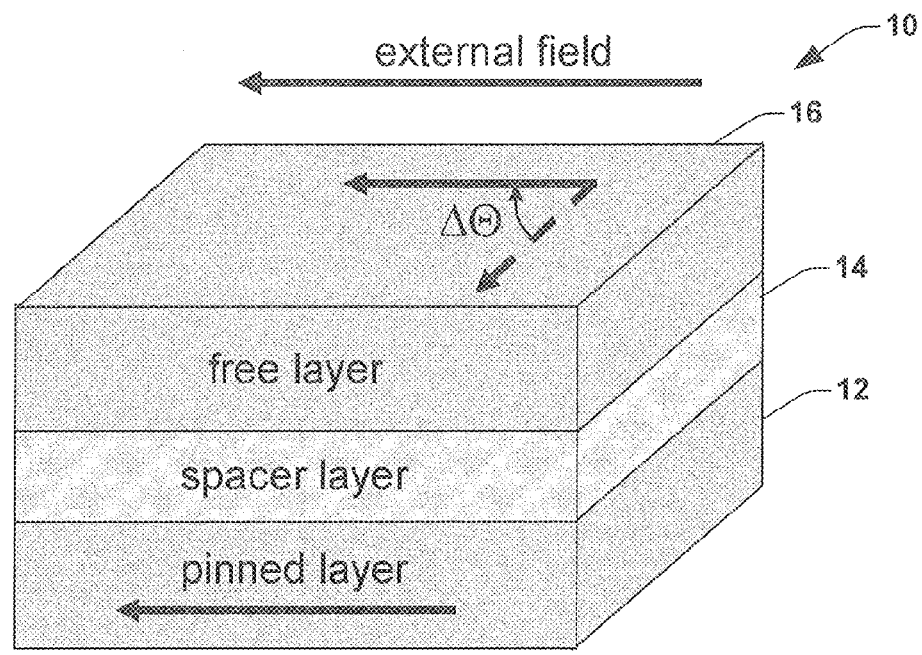
FIG. 1 illustrates a giant magnetoresistance sensing element.

The present disclosure will now be described with reference to the drawings wherein like reference numerals are used to refer to like elements throughout, and wherein the illustrated structures are not necessarily drawn to scale. Although various illustrated embodiments are described and illustrated as a hardware structure, the functionality and corresponding features of the present system can also be performed by appropriate software routines or a combination of hardware and software. Thus, the present disclosure should not be limited to any particular implementation and can be construed to cover any implementation that falls within the spirit and scope of the claims. Nothing in this detailed description is admitted as prior art.

Sensing systems using a magnetic field sensor such as a giant magnetoresistance (GMR) sensor are numerous. One exemplary sensing system using such a magnetic field sensor is a magnetic encoder application. In a magnetic encoder application, a magnetic encoder wheel is used to detect the rotational speed, position, acceleration and rotational direction of a shaft or gear. The encoder wheel has several magnetic domains (e.g., small permanent magnets) along the wheel circumference, and such domains generate a magnetic field pattern. If the encoder wheel rotates, causing the magnetic domains to pass local to a magnetic field sensor, the sensor will detect the change in magnetic field density.

Various types of magnetic field sensors exist, and all such magnetic field sensors are contemplated as falling within the scope of the present invention. One type of magnetic field sensor is the GMR sensor, a simplified portion of such a GMR sensor being illustrated in FIG. 1 at reference numeral 10. The GMR sensor 10 comprises at least three layers, and typically multiples of such layers, such layers comprising a pinned layer 12, a spacer layer 14 and a free layer 16. The pinned layer 12, also sometimes called the hard layer, has a fixed magnetic orientation, the direction of which cannot be altered by an externally applied magnetic field. The sensor 10 further comprises the free layer 16, sometimes referred to as a soft layer that exhibits a variable magnetic orientation that substantially follows the direction of an externally applied magnetic field. The pinned layer 12 and the free layer 16 are separated and magnetically decoupled from one another by the non-magnetic spacer layer 14 disposed therebetween.

Figures 2A, 2B:
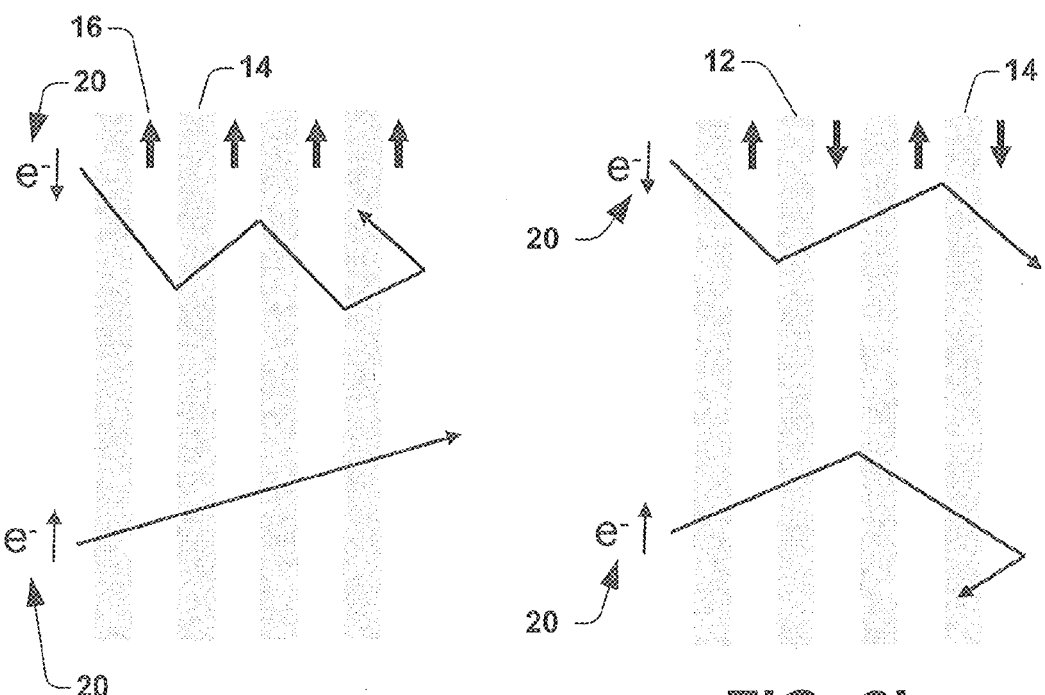
FIGS. 2a and 2b illustrate how scattering probability explains different magnetoresistances for two differing sensed external magnetic fields.

The GMR sensor 10 of FIG. 1 operates based on the GMR effect, which is a quantum mechanical magnetoresistance effect observed in thin film structures composed of alternating ferromagnetic and non-magnetic layers. It can be understood as interface scattering of conducting electrons when moving through the stack of magnetic layers separated by non-magnetic layers. As illustrated in FIG. 2a and FIG. 2b, each electron 20 has a spin that can be directed either "up" or "down" (based on spin rotation). The scattering probability of the electrons depends on the orientation of the spin and the magnetic moment of the layer. A parallel orientation (parallel alignment between the pinned layer 12 and the free layer 16) yields a low scattering probability (i.e., a low resistance) as seen in FIG. 2a, while an anti-parallel orientation illustrated in FIG. 2b leads to a high scattering probability and therefore to a high electrical resistance. The structure highlighted in FIG. 1 is sometimes referred to as a spin valve GMR.

Figure 3:
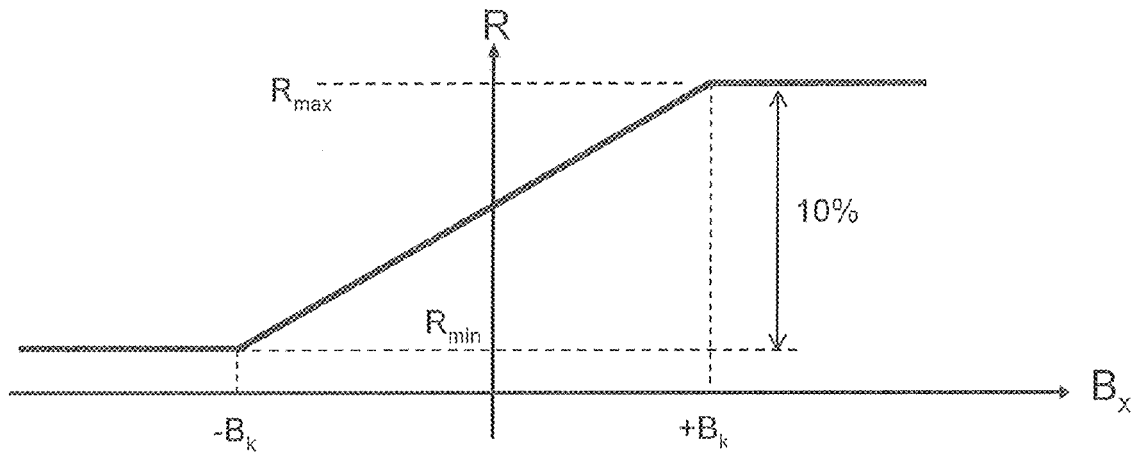
FIG. 3 is a graph illustrating different magnetoresistances for differing amounts of a particular magnetic field component.

As can be appreciated, the electrical resistivity of the structure varies based on the magnetization orientation of the pinned layer 12 with respect to the free layer 16. Thus the direction of an externally applied magnetic field will vary the electrical resistivity of the sensor based on its direction, or the vector component direction. In the above manner the GMR is a magnetoresistance, the value of which reflects a detected direction of an external magnetic field. More particularly, the electrical resistivity can be characterized more accurately in FIG. 3. As can be seen, for an externally applied magnetic field +Bk oriented in the generally opposite direction (anti-parallel) to the pinned layer 12 orientation (oriented in the −x direction), the resistance reaches a maximum amount (Rmax), after which the resistance saturates. Similarly, for an externally applied magnetic field that is generally parallel to the pinned layer 12 in the −x direction, the resistance reaches a minimum, non-zero amount (Rmin), after which the resistance also saturates. Between such saturation ranges (−Bk<Bx<+Bk) the magnetoresistance resistance profile of the sensor 10 is generally a linear function.

Figure 4:
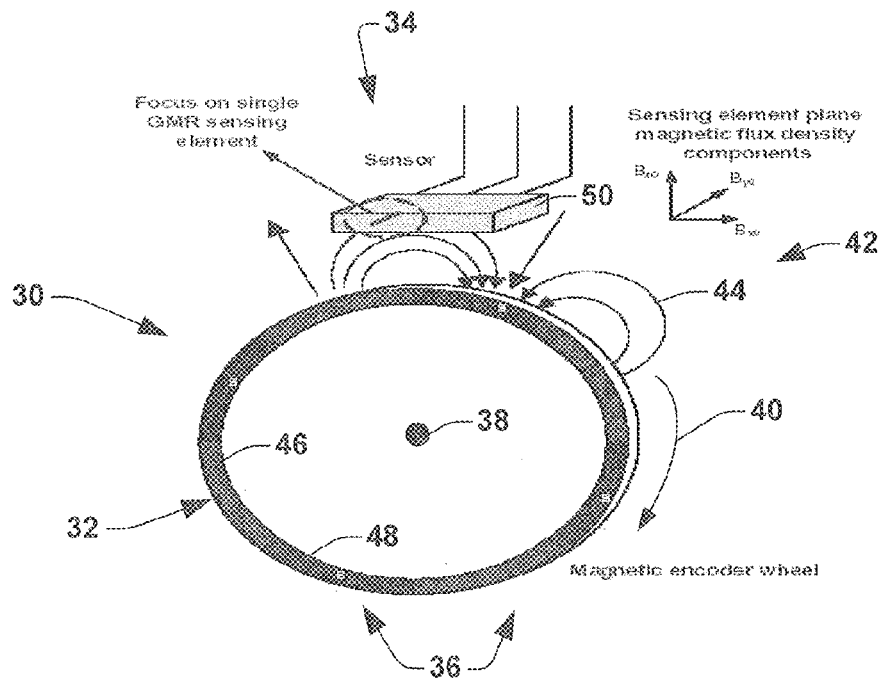
FIG. 4 is a perspective view of a magnetic sensor system employing a magnetic encoder wheel and a magnetic field sensing element.

Referring generally to FIG. 4, a sensing system 30 having a magnetic encoder wheel 32 and a magnetic field sensing element 34 is provided. For purposes of explanation, a Cartesian coordinate axis system is provided to aid in explaining how the various field components of the magnetic fields are sensed by the magnetic field sensing element. As can be seen in FIG. 4, the magnetic encoder wheel includes alternating pole magnetic domains 36 along a circumference thereof. In one embodiment, the magnetic domains 36 comprise permanent magnets oriented so that their respective poles alternate about the circumference of the wheel. The magnetic encoder wheel rotates about a first axis 38, for example, in a clockwise direction 40 as shown. In this particular example, the first axis 40 corresponds to the y-axis and points into the page.

As can be clearly seen in the figure, the alternating magnetic domains 36 result in magnetic fields 42 illustrated more particularly as magnetic field lines or flux lines 44. As shown, the magnetic field lines 44 originate on the first or north poles 46 and terminate or end on the second or south poles 48, respectively. The magnetic field sensing element 34 is in spatial proximity to the encoder wheel 32 such that the magnetic fields lines 44 are sensed thereat as the wheel 32 rotates about the first axis 38 in the clockwise rotation 40. In this example, a single magnetic field sensing element is illustrated within a sensor package 50, such as an integrated circuit package, however, multiple sensors may be employed (in a single IC package or in separate packages) and such alternative embodiments are contemplated as falling within the scope of the present invention.

As illustrated in FIG. 4, the magnetic field components of the magnetic fields 42 at the sensor element 34 are primarily in a direction parallel to the second axis (e.g., the x-axis) or a third axis (e.g., the z-axis), wherein the first, second and third axes are mutually perpendicular or orthogonal to one another. Therefore the axis of rotation of the wheel is parallel to the first or y-axis, while the poles 36, at the point they pass by the magnetic field sensor element 34, are generally moving tangential to and in a direction parallel to the second or x-axis.

Ideally, the magnetic field 42 sensed at the magnetic field sensor 34 has only an x-axis component Bx, while other field components, By=Bz=0. Thus, as the wheel rotates, for example, at a constant speed, the time dependence of Bx sensed at the magnetic field sensing element 32 is sinusoidal. As the rotation speed changes, such changes are detected in changes in the phase and/or frequency of the resultant signal. Ideal conditions, however, do not exist, and By and Bz do not equal 0. In particular, the non-zero By magnetic field component that is sensed by the magnetic field sensing element results in jitter, which denigrates the measurement sensitivity of the sensing system 30. More particularly, the inventor the present invention has discovered that several positioning issues of the sensing magnetic field sensor 34 with respect to the encoder wheel 32 affect system performance.

Figure 5:
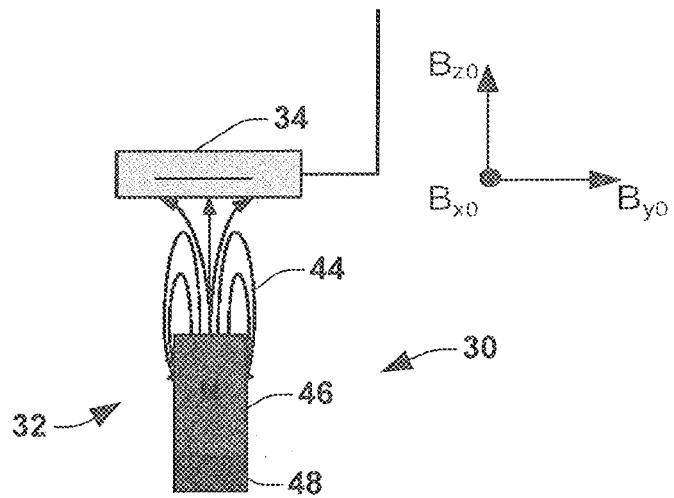
FIG. 5 shows a fragmentary view of a magnetic field sensor in proximity to a magnetic encoder wheel providing a magnetic field, and the various field components illustrated as flux lines.

FIG. 5 illustrates the sensing system 30 of FIG. 4 rotated by 90 degrees such that the second axis (i.e., the x-axis) is now directed into the page. This rotation of the system 30 helps better appreciate the role of the location of the magnetic sensing element 34 with respect to the encoder wheel 32. In the illustration of FIG. 5, the magnetic field sensing element 34 resides in a nominal position, wherein the sensor 34 is aligned with the center of the encoder wheel 32 in the x-direction, centered in the y-direction, and nominally spaced (with respect to air gap) in the z-direction. In such a nominal position, the Bx component and the Bz component are approximately equal, and By is approximately zero (due to the symmetric cancellation due to superposition).

Figure 6:
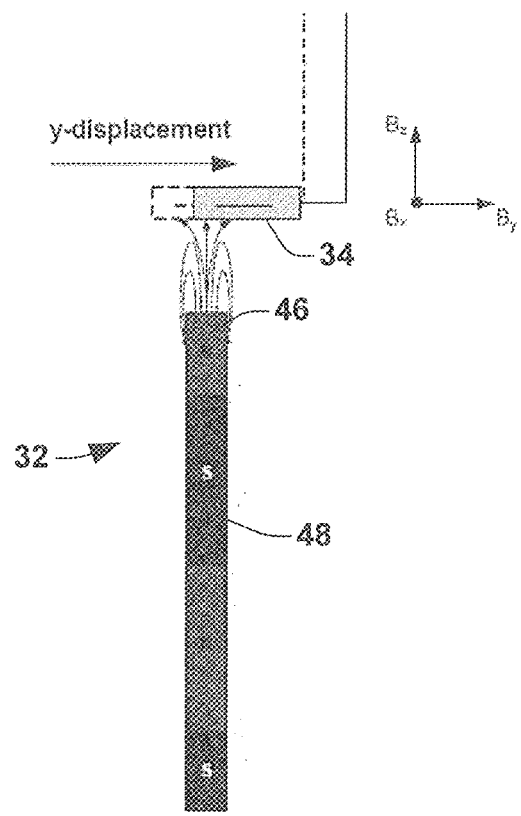
FIG. 6 shows an axially displaced magnetic field sensing element in proximity to a magnetic encoder wheel.

FIG. 6 illustrates a system condition where the magnetic field sensing element 34 is displaced in the y-direction, such that the sensing element 34 is not aligned in the y-direction with respect to the encoder wheel 32. More particularly, as can be seen in FIG. 6, the nominal sensor position is drawn in phantom while the new, offset location is displaced from the nominal position in the +y direction. Such axial displacement will impact on how the magnetic fields generated by the encoder wheel 32 affect the sensor 34. Compared to the fields from the nominal position (e.g., $Bx_0$, $By_0$, $Bz_0$), the field components detected by the sensor 34 at the displaced position are Bx, By and Bz, wherein $Bx<Bx_0$, $By>>By_0$, and $Bz<Bz_0$ (as absolute values). Depending on various factors, such as encoder wheel design such as wheel height, such displacement can increase phase jitter, thereby degrading performance. Such displacement can also negatively impact speed and direction signal data.

Figure 7:
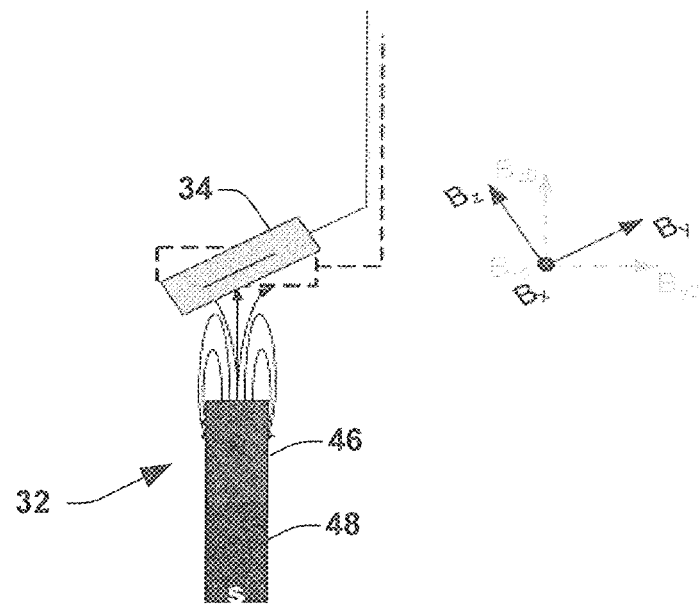
FIG. 7 is a fragmentary view of a magnetic field sensing means that is tilted off-axis in proximity to a magnetic encoder wheel providing a magnetic field, and the various field components illustrated as flux lines.

FIG. 7 illustrates a system condition where the magnetic field sensing element 34 exhibits a rotational error about the x-axis. This rotational error affects the magnetic field components detected by the sensor (Bx, By, Bz) as follows: $Bx \approx Bx_0$, $By>>By_0$, and $Bz<Bz_0$. Due to the illustrated tilt, or x-axis rotation error, the nominal position's z-component is now in the y-plane, which leads to a significant increase in the y-component By. As stated supra, the increase in By negatively affects phase jitter and potentially the speed and direction signals.

The inventor of the present invention appreciated the above problems and further appreciated that a reduction in the By field components despite axial displacement and sensor tilt would provide significant improvements in such a magnetic field sensor. The present invention employs a pole in conjunction with the magnetic field sensing element to urge or re-direct the problematic y-axis field components to the preferred x-axis.

Figure 8:
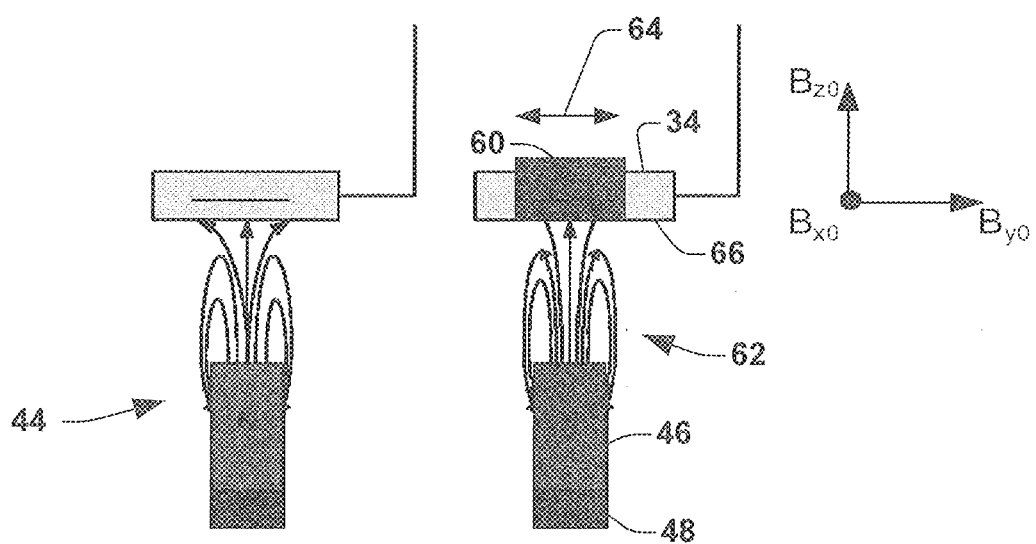
FIG. 8 shows fragmentary views of a magnetic field sensor in proximity to a magnetic encoder wheel providing a magnetic field, and a magnetic field sensor having a through pole associated therewith, and the various field components illustrated as flux lines that are re-directed to a preferred axis according to one embodiment of the invention.

FIG. 8 illustrates a magnetic field sensing element 34 having a pole 60 that abuts, and in one embodiment surrounds, a portion of the sensor package. In the example illustrated in FIG. 8, the pole 60 extends along the sensor in the x-direction (into the page), while surrounding the sides of the package in the z-direction. Thus one embodiment of the invention provides for a ferrous pole material with a z-axis surround that is added to the backside of the magnetic sensor package that operates to conduct or transfer the problematic By filed components to the preferred x-direction. As can be seen in FIG. 8, on the left hand side is a picture of a sensing element 34 without a pole piece 60. In the figure one can see the magnetic field lines 44 and how they drift in the positive and negative y-directions. As can be seen in the right hand side of the figure, the pole piece 60 causes the magnetic field lines 62 to become elongated and the y-components of the fields are drawn to the desired x-axis. This re-direction of the magnetic fields results in better air gap capability and improved jitter performance. In this embodiment, the performance of the pole is optimized by extending the full length 64 of the sensor (e.g., GMR sensor) within the package 66, and the pole piece 60 or shroud runs the full width of the IC package (into the page). Alternatively, the pole piece 60 may extend the full length of the package and have other shapes or geometries.

FIGS. 9a and 9b are isometric views of the magnetic sensing element in a package 70 having a pole piece 60 engaging the package, for example, surrounding a portion of the package. FIG. 9b illustrates solely the pole piece 60 in isometric view. In the example provided in FIGS. 9a and 9b, the ferrous pole piece 60 is added to the backside of the integrated circuit and is physically affixed thereto. Alternatively, any pole piece in physical proximity to the magnetic field sensor that is operable to re-direct the y-component fields toward the x-axis is contemplated as falling within the scope of the present invention.

FIG. 10 illustrates the effect the pole piece 60 has on the magnetic field lines 62, and how the x-axis tilt effects are mitigated by the present invention. As can be seen, the magnetic field lines 62 are elongated and directed toward the dense, preferred x-axis.

Figure 11:
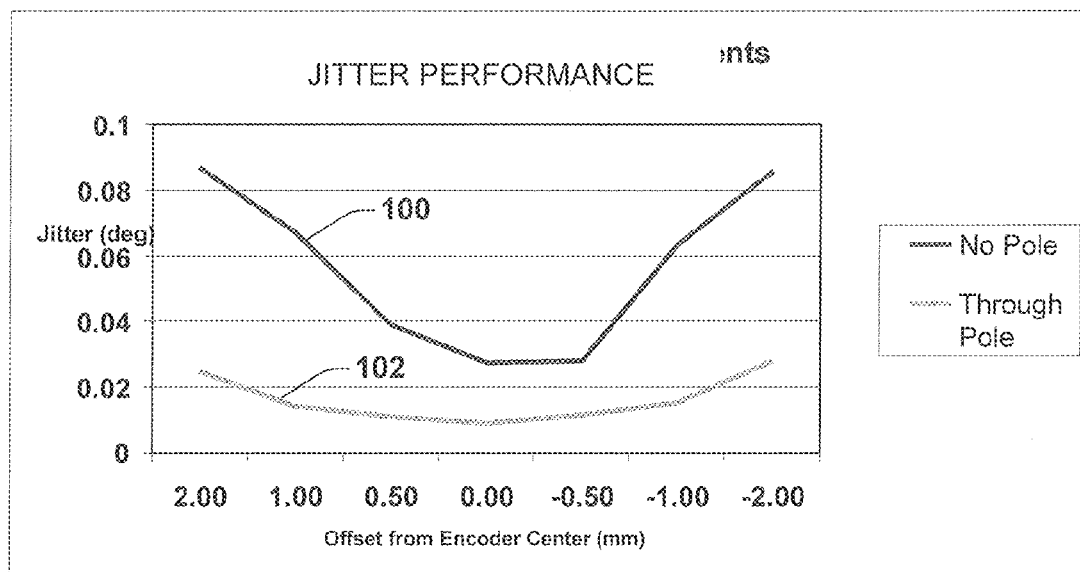
FIG. 11 is a graph illustrating the improvement in jitter performance provided by the pole piece for situations where the magnetic field sensing element experiences axial displacement with respect to its nominal position.

FIG. 11 is a graph that illustrates jitter performance for an encoder wheel sensor system for varying amounts of offset or axial displacement. The jitter performance graph provides for two different conditions, one for the magnetic field sensing element without a pole piece 100, and one for the magnetic field sensing element with a pole piece 102. As can be seen by the two graphs, the pole piece provides for a significant improvement in jitter performance when the sensor is in its optimal location (no offset) as well as at all amounts of offset. In fact, as the amount of offset or axial displacement increases, the amount of improvement over the no pole solution increases, wherein at a displacement of ±2 mm, the jitter performance is approximately 3-4× better with the through pole 60 than without it.

Figure 12:
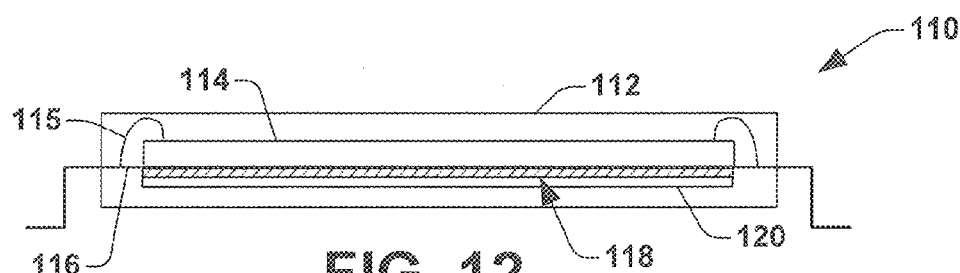
FIG. 12 is a cross section diagram illustrating an integrated circuit package having a die containing a magnetic field sensing element thereon, and a pole piece integrated into the package according to one embodiment.

In the embodiments discussed supra and illustrated, for example, in FIGS. 9a and 9b, the pole piece 60 was affixed or positioned external and adjacent to the magnetic sensing element that resides within an integrated circuit package. Alternatively, a pole piece or other type magnetic flux influencing element may reside within the integrated circuit package. For example, as illustrated in FIG. 12, an integrated circuit package 110 is illustrated. While a typical package configuration is illustrated in FIG. 12, a different type of package is illustrated in FIG. 9a, and it should be understood that any type of integrated circuit package configuration is contemplated as falling within the scope of the present invention.

The package 110 has a mold compound 112 or ceramic or other type lid that covers an integrated circuit die 114. In one embodiment the die has one or more magnetic field sensing elements integrated thereon. Bonding wires 115 electrically connect circuit from the die 114 to respective leads on a leadframe 116. Alternatively, the bonding wires 115 may be replaced with solder balls or other attachment elements. In one embodiment, an electrically insulating layer 118 is attached or otherwise formed to a backside of the leadframe 116 and a ferrous material comprising a pole piece 120 is attached thereto, thereby electrically insulated from the leadframe 116. In the above manner, the pole piece 120 may be customized with respect to its shape and reliably positioned with respect to the one or more magnetic field sensing elements so as to optimize sensor performance. Note that in FIG. 12, the view is a cross section, consequently the pole piece tabs or ear portions are not illustrated. If the package were rotated by 90 degrees, such tabs or ear portions, in at least one embodiment would be visible, rising up and covering a side portion of the sensor die 114.

In another embodiment of the structure of FIG. 12, the leadframe structure 116 itself is formed of or covered with a ferrous material, either completely or partially. With this structure the pole piece 120 becomes an integral part of the leadframe 116, thereby reducing the total number of parts and providing flexibility in fashioning its shape and structure.

Figure 13:
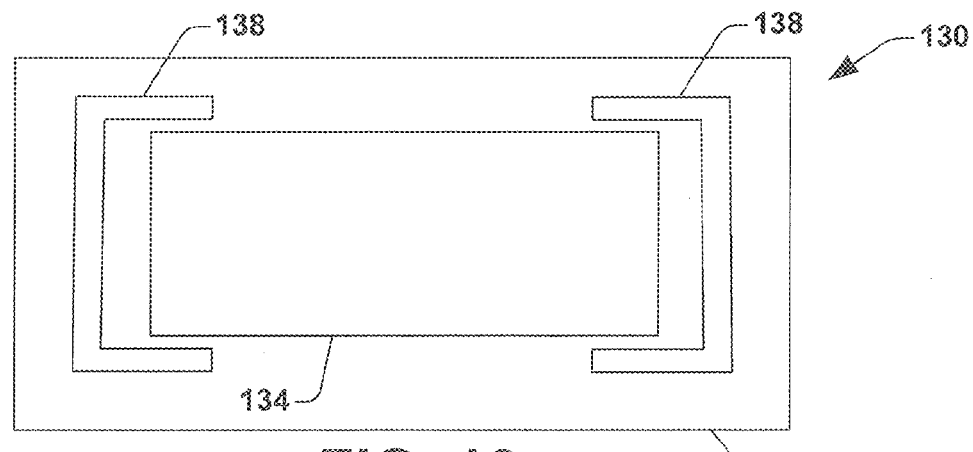
FIG. 13 is a cross section diagram illustrating an integrated circuit die having a magnetic field sensing element formed thereon and a pole piece integrated into the integrated circuit according to another embodiment.

In another alternative embodiment, a pole piece is integrated into the die containing the magnetic field sensing element, as illustrated in FIG. 13. FIG. 13 shows a plan view of a die 130 having a semiconductor or other type substrate 132 on which one or more magnetic field sensing elements 134 are built, along with other support circuitry, if desired. An insulating dielectric layer is formed over and around the substrate 132 and circuitry 134. In the dielectric layer, one or more pole pieces 138 are formed, comprised of a ferrous material. In the illustrated example, the pole piece 138 is formed like a shield, cap or shroud that surrounds the magnetic field sensing element 134. Alternatively, the pole piece 138 simply approximates the dimensions of the one or more sensors. Further, while FIG. 13 illustrates the pole piece 138 on a front or top side of the die, an alternative arrangement may be employed with a flip chip type configuration with the top side of the die flipped upside down and coupled to a leadframe or printed circuit board (PCB) via solder balls, for example. In such an arrangement, a dielectric layer 136 may contain or encompass the pole piece 138 on or in the backside portion of the die, as may be desired. Any such type of integration alternative is contemplated as falling within the scope of the present invention.

In regard to the various functions performed by the above described components or structures (units, nodes, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A sensing system, comprising:
    a magnetic field sensing element arrangeable in a spatial relationship with a magnetic encoder wheel comprising alternating pole magnetic domains along a circumference thereof, wherein the magnetic encoder wheel is rotatable around a first axis, the magnetic field sensing element configured to sense magnetic field components extending generally in a direction parallel to a second axis that is perpendicular to the first axis; and
    a magnetic flux influencing element configured to influence magnetic field components associated with the alternating pole magnetic domains of the magnetic encoder to reduce magnetic field components associated with the first axis,
    wherein the magnetic flux influencing element comprises a structure comprising a ferrous path configured to redirect magnetic fields to decrease components of magnetic fields associated with a direction that is parallel with the first axis and concurrently increase components of the magnetic fields in a direction that is parallel with the second axis.

2. The sensing system of claim 1, wherein the magnetic flux influencing element comprising a structure comprises a pole piece extending in a direction parallel to the first axis a first distance, and extending in a direction parallel to the second axis a second distance, wherein the second distance is greater than the first distance.

3. The sensing system of claim 2, wherein the pole piece first distance is approximately equal to a width of the magnetic field sensing element.

4. The sensing system of claim 2, wherein the pole piece wraps around at least a portion of the magnetic field sensing element, thereby providing a relatively lower magnetic resistance path through the magnetic field sensing element compared to paths laterally disposed from the magnetic field sensing element in directions parallel to the first axis.

5. The sensing system of claim 1, wherein the magnetic field sensing element comprises a giant magnetoresistance (GMR) sensor or an anisotropic magnetoresistance (AMR) sensor.

6. The sensing system of claim 5, wherein the magnetic field sensing element comprises a GMR sensor, comprising:
    a pinned layer having a fixed magnetic orientation;
    a free layer having a magnetic orientation that varies to follow a direction of an external magnetic field; and
    a spacer layer disposed between the pinned layer and the free layer, and configured to separate and magnetically decouple the pinned layer and the free layer,
    wherein a magnetic orientation of the free layer based on an external magnetic field and the pinned layer affects a scattering probability of electrons when moving through the GMR sensor, thereby affecting an electrical resistivity thereof.

7. The sensing system of claim 1, wherein the magnetic field sensing element resides within an integrated circuit package, and wherein the magnetic flux influencing element comprises a ferrous pole piece attached to an external surface of the integrated circuit package.

8. The sensing system of claim 7, wherein the ferrous pole piece is oriented with respect to the integrated circuit package to increase a magnetic flux density of magnetic field components in the second direction.

9. The sensing system of claim 1, wherein the magnetic field sensing element and a ferrous pole piece resides within an integrated circuit package, and wherein the integrated circuit package is oriented with respect to the magnetic encoder wheel to increase a magnetic flux density of magnetic field components in the second direction.

10. The sensing system of claim 1, wherein the magnetic field sensing element and the magnetic flux influencing element are both integrated onto a single integrated circuit die.

11. The sensing system of claim 10, wherein the magnetic flux influencing element comprises a ferrous material formed in one or more upper metallization layers of the single integrated circuit die.

12. A magnetic field sensor, comprising:
    a magnetic field sensing element configured to sense magnetic field components extending generally in a direction within a sensing plane defined by a preferred direction and further direction, the further direction being perpendicular to the preferred direction; and
    a magnetic flux influencing element configured to influence magnetic field components within the sensing plane, such that magnetic field components parallel to the further direction are reduced while magnetic field components parallel to the preferred direction are increased;
    wherein the magnetic flux influencing element comprises a structure comprising a ferrous path configured to redirect magnetic fields.

13. The sensor of claim 12, wherein the magnetic flux influencing element comprising the structure comprises a pole piece extending in a direction parallel to the preferred axis direction a first distance, and extending in a direction parallel to the at least one of the one or more orthogonal directions a second distance, wherein the second distance is greater than the first distance.

14. The sensor of claim 13, wherein the pole piece first distance is approximately equal to a width of the magnetic field sensing element.

15. The sensor of claim 13, wherein the pole piece wraps around at least a portion of the magnetic field sensing element, thereby providing a relatively lower magnetic resistance path through the magnetic field sensing element compared to paths laterally disposed from the magnetic field sensing element in directions parallel to the one or more orthogonal axes.

16. The sensor of claim 12, wherein the magnetic field sensing element comprises a giant magnetoresistance (GMR) sensor or an anisotropic magnetoresistance (AMR) sensor.

17. The sensor of claim 16, wherein the magnetic field sensing element comprises a GMR sensor, comprising:
 a pinned layer having a fixed magnetic orientation;
 a free layer having a magnetic orientation that varies to follow a direction of an external magnetic field; and
 a spacer layer disposed between the pinned layer and the free layer, and configured to separate and magnetically decouple the pinned layer and the free layer,
 wherein a magnetic orientation of the free layer based on an external magnetic field and the pinned layer affects a scattering probability of electrons when moving through the GMR sensor, thereby affecting an electrical resistivity thereof.

18. The sensor of claim 12, wherein the magnetic field sensing element resides within an integrated circuit package, and wherein a magnetic element is arranged relative to a face of the structure of the magnetic flux influencing element, wherein a magnetization of the magnetic element is dominantly arranged in a direction perpendicular to the face of the structure of the magnetic flux influencing element.

19. The sensor of claim 18, wherein the ferrous pole piece is oriented with respect to the integrated circuit package to increase a magnetic flux density of magnetic field components in a direction parallel to the preferred direction.

20. The sensor of claim 12, wherein the magnetic field sensing element and a ferrous pole piece resides within an integrated circuit package.

21. The sensor of claim 20, wherein the ferrous pole piece comprises at least a part of a leadframe within the integrated circuit package.

22. The sensor of claim 12, wherein the magnetic field sensing element and the magnetic flux influencing element are both integrated onto a single integrated circuit die.

* * * * *